(12) United States Patent
Kawai et al.

(10) Patent No.: US 6,345,138 B1
(45) Date of Patent: Feb. 5, 2002

(54) OPTICAL FIBER OUTPUT SEMICONDUCTOR DEVICE

(75) Inventors: Kiyoyuki Kawai, Yokosuka; Ritsuo Yoshida, Zushi; Masanobu Kimura, Kamakura; Ken Itou, Yamato; Kazuyoshi Fuse, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/457,351

(22) Filed: Dec. 9, 1999

(51) Int. Cl.[7] ................................ G02B 6/30
(52) U.S. Cl. .................. 385/49; 385/43; 385/88; 385/52; 385/51
(58) Field of Search ...................... 385/49, 50, 52, 385/43, 88, 90, 92

(56) References Cited

U.S. PATENT DOCUMENTS 5,265,177 A * 11/1993 Cho et al. .................. 385/43
6,084,050 A * 7/2000 Ooba et al. ................. 385/145
6,169,838 B1 * 1/2001 He et al. .................... 385/129

OTHER PUBLICATIONS

Kawano, "Hikari Ketsugoukei no Kiso to Ouyou", Jan. 25, 1991.

* cited by examiner

Primary Examiner—Cassandra Spyrou
Assistant Examiner—Fayez Assaf
(74) Attorney, Agent, or Firm—Pillsbury Winthrop LLP

(57) ABSTRACT

To obtain an inexpensive, high-power optical fiber output semiconductor device, an edge emitting type semiconductor element, a tapered optical waveguide having a structure for accommodating expansion and contraction due to a change in temperature, and an optical fiber are prepared separately. One edge of the tapered optical waveguide is butt-joined to an output face of the edge emitting type semiconductor element. The other edge of the tapered optical waveguide is connected to the optical fiber.

15 Claims, 6 Drawing Sheets

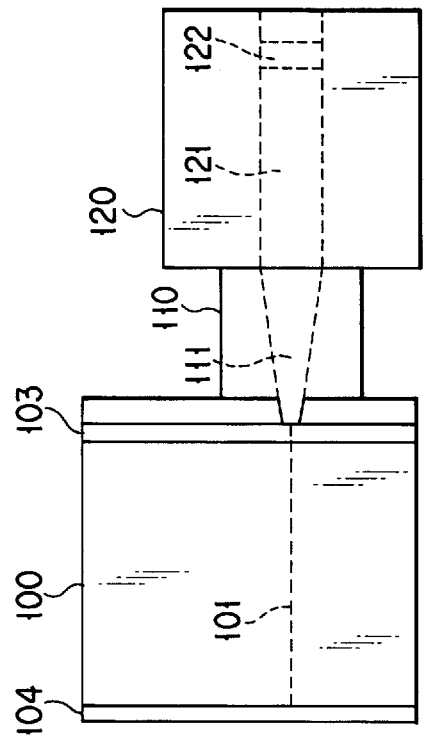
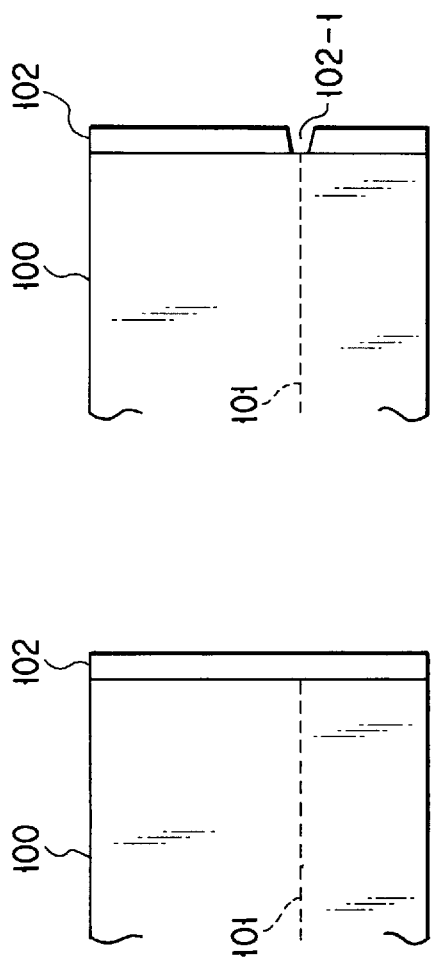
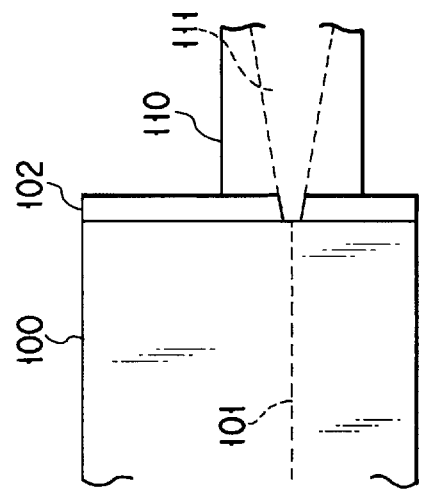

OPTICAL FIBER OUTPUT SEMICONDUCTOR DEVICE

BACKGROUND OF THE INVENTION

The present invention relates to an optical fiber semiconductor device effective as a laser light source, i.e., a combination of an optical fiber and a semiconductor laser. According to the present invention, an optical fiber semiconductor device is produced at a low cost and an output thereof can be increased. Therefore, the device can be used for various purposes, not only for communications.

When a semiconductor laser diode (semiconductor laser) of edge emitting type and an optical fiber are optically coupled, optical means for converting a divergent beam output from the semiconductor laser to a beam which can be easily input to the fiber is required in order to suppress coupling loss. Further, it is important that these elements (the semiconductor laser, the optical means and the optical fiber) be accurately positioned.

A laser beam output from a semiconductor laser has a spread of an angle of about ±20° in the vertical direction and about ±5° to 10° in the horizontal direction in free-space propagation in the air. Therefore, when the edge of a semiconductor laser and an optical fiber are directly connected (butt joint), coupling loss of about 10 dB is caused. Therefore, to reduce the coupling loss, the beam is converted by optical means such as a lens. Further, in optical communication for the purpose of long-distance and large-capacity communication, a single mode fiber having a core diameter of 10 $\mu$m or less is used. Therefore, when this type of optical fiber is coupled to a semiconductor laser, they must be positioned with a high accuracy of 1 $\mu$m or less.

An example of the conventional semiconductor laser module for use in optical communication will be described with reference to FIG. 1.

"Foundation and Application of Optical Coupling System for Optical Device", Kenji Kono, GendaiKogakuSha, page 89 shows a schematic cross sectional view and an external view of a semiconductor laser module. The same publication, page 77 discloses a lens structure of the module of this type.

The semiconductor laser module has an InGaAsP/InP semiconductor LD of an oscillation wavelength of 1.29 $\mu$m. The module includes a sphere lens 1 and GRIN (graded-index) rod lenses 2-1 and 2-2. The sphere lens 1 and the rod lens 2-1 are solder-fixed to a metal holder.

A single mode fiber SMF is fixed to a ferrule. The ferrule and the GRIN rod lens 2-2 are fixed to an integrating holder with machining accuracy without optical adjustment. The integrated structure of the single mode fiber and the GRIN rod lens 2-2 is called a virtual fiber, since it can be regarded as a virtual single mode optical fiber having an enlarged spot size.

The elements of the laser module are assembled and adjusted as follows.

(1) The holder of the sphere lens 1 is fixed to the heat sink of the semiconductor laser.

(2) The semiconductor laser LD and the holder of the sphere lens 1 are hermetically sealed together with nitrogen gas within a package in order to maintain the reliability of the semiconductor laser.

(3) An optical output from the single mode optical fiber is monitored by a power meter. To obtain the maximum optical output, the holder of the rod lens 2-1 is adjusted in a direction perpendicular to the optical axis, and the virtual fiber is adjusted in the direction of the optical axis and a direction perpendicular to the optical axis. At this time, the axial dislocation, which may occur when the holder of the sphere lens 1 is fixed to the heat sink of the semiconductor laser, is automatically corrected.

(4) The holder of the rod lens 2-1 is fixed to the semiconductor laser package.

(5) The virtual fiber is position-adjusted in the direction of the optical axis and a direction perpendicular to the optical axis, and the axial dislocation of the rod lens 2-1 is corrected. Thereafter, first, the virtual fiber is fixed to a holder in the direction of the optical axis. Then, the virtual fiber holder is fixed to the holder of the rod lens 2-1. Thus, the elements are fixed in a direction perpendicular to the optical axis.

As can be understood from the above description, in the case where the aforementioned optical lenses are assembled to couple the semiconductor laser and the optical fiber, a metal package of a coaxial structure is employed to reduce the influence of a change in temperature. Moreover, a number of very accurate adjusting steps are required. In the above example, the virtual fiber is adjusted simultaneously in the direction of the optical axis and a direction perpendicular to the optical axis to adjust the rod lenses in the direction of the optical axis. It is very difficult to adjust a number of parameters at the same time. In addition, an optimum value cannot be easily obtained.

In particular, if the single mode fiber has a diameter of 10 $\mu$m or smaller, since the positional accuracy must be 1 $\mu$m or less, many parameters must be adjusted simultaneously with high accuracy. For this reason, the semiconductor laser module produced in the above method is very expensive, since the adjustment requires a very long period of time, resulting in an increase in manufacturing cost.

Further, to increase an optical power up to the watt class in a semiconductor laser, it is necessary to extend the active layer. Particularly in a GaAs-based semiconductor, when the optical density is increased, optical damage may occur. Therefore, the optical density is limited to about 1 MW/cm$^2$. Since the thickness of the activation layer is determined to a limited value in order to maintain the light emission efficiency, it is necessary to increase the width of the active layer. Specifically, the width of the active layer is extended to 150 $\mu$m to 500 $\mu$m to realize a laser in the watt class.

However, in general, it is very difficult to converge by a coupled optical system a light beam emitted from a light source having considerably different dimensions in the vertical direction (the thickness of the active layer of about 0.1 $\mu$m ) and the horizontal direction (the width of the active layer of about 150 $\mu$m to 500 $\mu$m ) to a fiber having a diameter of about, for example, 10 $\mu$m. In other words, it is practically difficult to suppress the coupling loss, if a high-power semiconductor laser and an optical fiber are coupled by combining the optical lenses in the aforementioned manner.

As described above, when a high-power semiconductor laser and an optical fiber are coupled by means of an imaging optical system including the conventional optical members, a high cost is required, since a precision structure and accurate adjustment are required. In addition, the connection of an optical fiber with a high-power semiconductor laser arises the serious problem of an increase in coupling loss.

For the reasons stated above, the conventional optical fiber output semiconductor device comprising an imaging optical system, in which small lenses are combined, uses a metal housing to ensure the reliability and requires positional adjustment with high accuracy in assembly time. Therefore, although an LD (laser diode) chip itself is inexpensive, the module as a whole is inevitably very expensive. Moreover, because of the increase in coupling loss, it is practically very difficult to convert a divergent optical beam in the watt class, output from a semiconductor laser of edge emitting type, to an optical fiber beam. Therefore, a high-power optical fiber output semiconductor device has not been realized.

BRIEF SUMMARY OF THE INVENTION

It is accordingly an object of the present invention to provide an inexpensive, high-power optical fiber output semiconductor device.

To achieve the above object, an optical fiber output semiconductor device of the present invention comprises: an edge emitting type semiconductor element having an active layer and an output face; a tapered optical waveguide having a structure for accommodating expansion and contraction due to a change in temperature and a first end butt-joined to the output end of the edge emitting type semiconductor element; and an optical fiber connected a second end of the tapered optical waveguide.

The basic structure of the present invention is the combination of an edge emitting type semiconductor chip, a tapered optical waveguide for accommodating expansion and contraction, and an optical fiber.

The optical fiber output semiconductor device of the present invention may have the following features. The tapered optical waveguide may be made of silicone material. A guide groove may be formed on the edge emitting type semiconductor chip. The semiconductor chip and the optical waveguide may be assembled by means of self-aligning and a laser process. If an SLD (super luminescent diode) is used, it may be combined with an external mirror resonator by means of a laser self-aligning process. Alternatively, the semiconductor chip and the optical waveguide may be assembled by means of self-aligning and a resist process.

In the optical fiber output semiconductor device, assuming that a z-axis represents a direction of travel of light, and an x-axis and a y-axis represent two axes on planes perpendicular to the z-axis, the width of the tapered optical waveguide along the x-axis decreases with travel of the light and the width thereof along the y-axis increases with travel of the light. The index of refraction of the core portion of the tapered optical waveguide may decrease as the thickness of the core portion increases. The core portion may comprise a plurality of thin films having different indexes of refraction. A plane wave in the width direction may be converted to a spherical wave. To obtain a graded index, the core portion may include a graded index lens. The graded index lens may comprise a plurality of thin films having different indexes of refraction. An antireflection film may be formed on the output end of the semiconductor chip. The active layer of the edge emitting type semiconductor chip may be tapered in the width direction. The edge emitting type semiconductor element may comprise two emission edges, each connected to a tapered optical waveguide and an optical fiber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4E are diagrams for explaining another embodiment of the present invention including a semiconductor chip of edge emitting type, both ends of which are covered by thin films;

DETAILED DESCRIPTION OF THE INVENTION

Embodiments of the present invention will be described with reference to the accompanying drawings.

Figure 1:
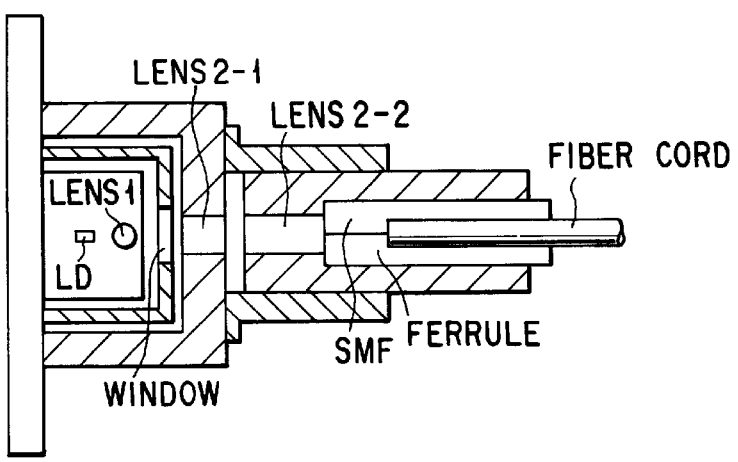
FIG. 1 is a diagram for explaining the structure of a conventional semiconductor laser device.
Figure 2A:
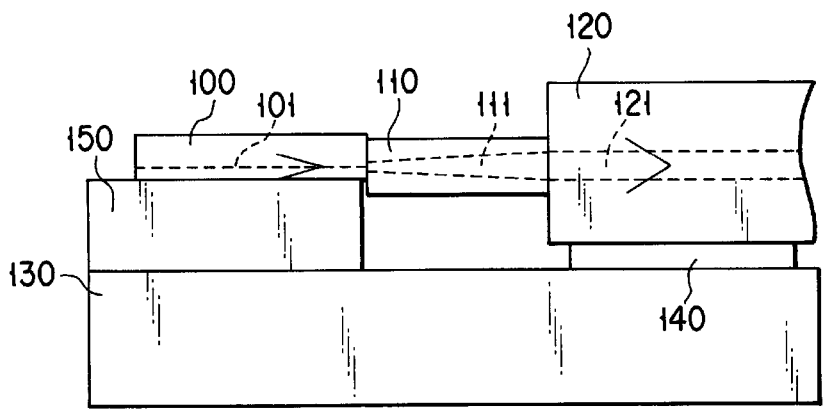
FIG. 2A is a side view showing the basic structure of the device of the present invention.
Figure 2B:
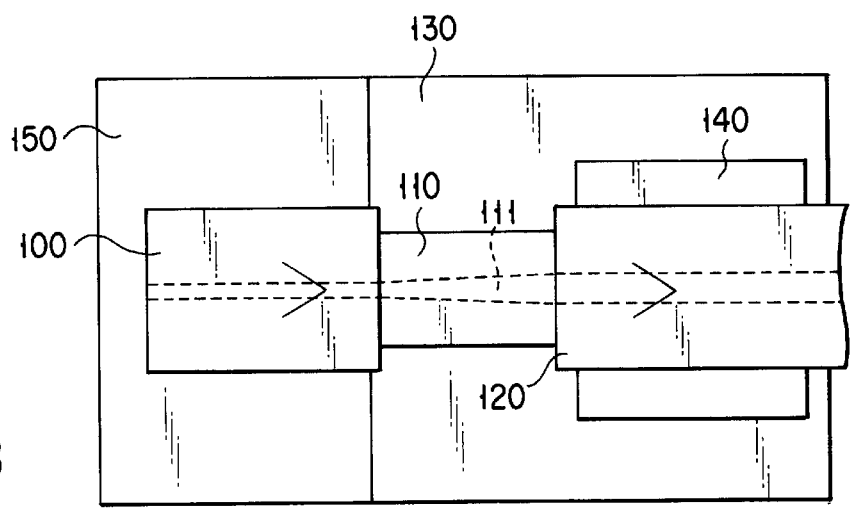
FIG. 2B is a plane view showing the basic structure of the device of the present invention.

A first embodiment will be described. FIGS. 2A and 2B show a basic structure of the present invention. A laser beam output from a semiconductor laser chip 100 of edge emitting type passes through a tapered optical waveguide 110, changing its optical beam shape. Then, the beam is incident on an optical fiber 120.

FIG. 2A is a side view and FIG. 2B is a top view.

An active layer 101 of the edge emitting type semiconductor laser chip 100 is very thin. The thickness thereof is determined to a limited value to increase the conversion efficiency. For example, the active layer 101 is about 0.1 $\mu$m thick. Since the difference in index of refraction between the active layer and upper and lower layers is small, a beam having a half-width of, for example, 1 $\mu$m is spread from the edge.

On the other hand, the active layer 101 is wide in the width direction. Particularly, to obtain a high power, in the case of a GaAs-based laser, the optical density at the light output portion must be 1 MW/cm² or lower, so that an optical damage may not be caused. Therefore, the active layer must be inevitably wide. In some semiconductor layers, the active layer is 100 μm or wider.

In contrast, the core of an optical fiber generally has a circular cross section. For example, if the core has a diameter of 10 μm, it is narrower in the width direction and thicker in the thickness direction as compared to the active layer of the general edge emitting type semiconductor laser. The optical devices, through which different shapes of optical beam pass, are coupled by the tapered optical waveguide 110, changing the optical beam shapes.

Referring to FIGS. 2A and 2B, the edge emitting type semiconductor laser chip 100, the tapered optical waveguide 110 and the optical fiber 120 are PC (physical contact) connected by butt joint. In each contact portion, if the elements are deviated in fore-and-aft directions along the optical axis or deviated from the optical axis, the coupling loss is considerably increased. To suppress the loss, the butt joint accuracy of the submicron order is required. In addition, the accuracy must be maintained in spite of a change in temperature or aging. Since the core of the optical fiber 120 generally has a circular cross section, it is particularly preferable that the shape of that side of the tapered optical waveguide 110 connected to the optical fiber be also circular. However, even if that side of the tapered optical waveguide is rectangular, the connecting loss cannot be seriously great, since there is no considerable difference in shape between beams passed through circular and rectangular sides. Rather, deviation in fore-and-aft directions along the optical axis and deviation from the optical axis cause great loss.

The semiconductor chip 100 is mounted on a ceramic sub-substrate 150, which is mounted on a metal substrate 130. The edge emitting type semiconductor chip 100, the tapered optical waveguide 110, the optical fiber 120, the ceramic sub-substrate 150 and the metal substrate 130 have different coefficients of expansion. Therefore, the relative position of these elements and the shapes of contact portions are changed, as the temperature changes. The optical fiber 120 is mounted on an optical fiber base 140. Antireflection film may be added to the output edge of the edge emitting type semiconductor chip on the side of the optical waveguide.

According to this invention, the tapered optical waveguide 110 is formed of rubbery material, such as silicone, so that the aforementioned change in relative position or shape of contact portion can be accommodated.

Figure 3:
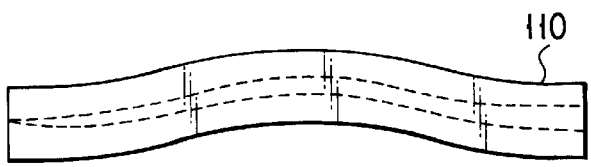
FIG. 3 is a diagram showing an another example of a tapered optical waveguide shown in FIGS. 2A and 2B.

The same effect can be obtained by the structure as shown in FIG. 3, in which the tapered optical waveguide 110 made of polycarbonate or the like is warped.

FIGS. 4A to 4E show a second embodiment. As shown in FIG. 4A, a thin film 102 is formed on an output face of an edge emitting type semiconductor chip 100. An optical output of 0.1 to 1 MW/cm² can be easily obtained at an output edge of an active layer 101. Therefore, if the edge emitting type semiconductor laser chip 100 is operated after the thin film 102 is formed, a part of the thin film 102 can be laser-processed, i.e., melted or sublimed. As a result, as shown in FIG. 4B, a hole is formed in an optical output portion, thereby forming a recess connection guide 102-1.

As shown in FIG. 4C, a projected connection guide 112 is formed in advance in a connecting portion of the tapered optical waveguide 110. With this structure, as shown in FIG. 4D, the connection guide 112 and the edge emitting type semiconductor chip 100 can be mechanically butt-joined very accurately.

FIG. 4E shows an example of a hybrid laser constituted by the optical fiber 120 and the edge emitting type semiconductor chip 100. A fiber grating 122 is formed on an end of the optical fiber 120, thereby forming an reflection end. A low reflection film (AR film) 103 is formed between one side of the edge emitting type semiconductor chip 100 and the tapered optical waveguide 110. The other side of the semiconductor chip 100 is covered with a high reflection film (HR film) 104. The optical fiber 120 and the HR film 104 constitute an optical resonator.

Since the low reflection film (AR film) 103 is generally formed of a dielectric having high insulating properties, the thin film 102 may be made of metal or the like.

In general, a cleavage plane of a semiconductor is used as an reflection edge of the edge emitting type semiconductor chip 100. In this case, both edges of the active layer 101 function as reflection edges, which constitute an optical resonator, resulting in laser oscillation. However, if one edge (or both edges) of the edge emitting type semiconductor chip 100 is covered by the AR film 103 as shown in FIG. 4E, the semiconductor chip 100 cannot singly constitute an optical resonator, and laser oscillation will not occur. Therefore, the semiconductor laser chip can output merely a low-density light beam.

Figure 5A:
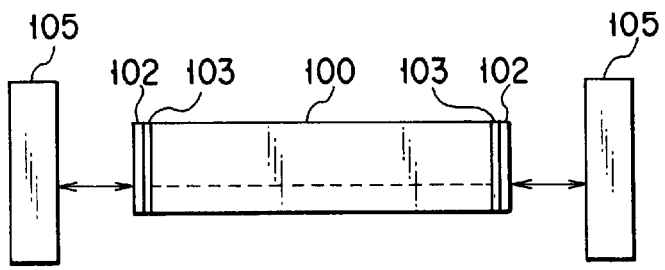
FIGS. 5A, and 5B are diagrams for explaining still another embodiment of the present invention including a semiconductor chip of edge emitting type, both edges of which are covered by AR (antireflection) films.
Figure 5B:
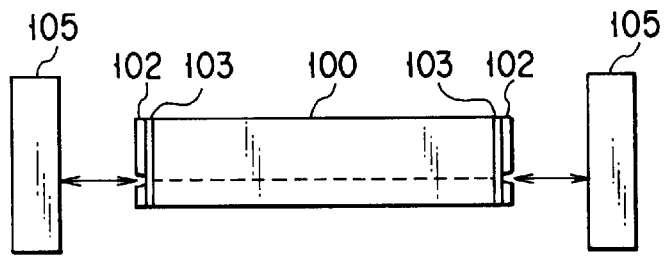

FIGS. 5A and 5B show an edge emitting type semiconductor chip 100 both edges of which are covered by AR films 103. In this case, as shown in FIG. 5A, the edge emitting type semiconductor chip 100 is placed between two external light resonators 105 constituted by plane mirrors or concave mirrors. When a laser beam is emitted in this structure, the external light resonators perform laser oscillation. As a result, recess connection guides are formed in the thin films 102, as shown in FIG. 5B.

In the methods described with reference to FIGS. 4A to 4E and FIGS. 5A and 5B, the thin film 102 is laser-processed. The thin film 102 may be made of positive photoresist, which is sensitized by light output from the edge emitting type semiconductor chip 100. After the edge emitting type semiconductor chip emits light beam, the photoresist is developed. In this case also, the same effect as described above is obtained.

Figure 6A:
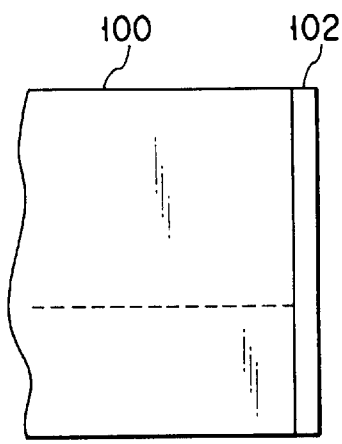
FIGS. 6A to 6C are diagrams showing further embodiment of the present invention.
Figure 6B:
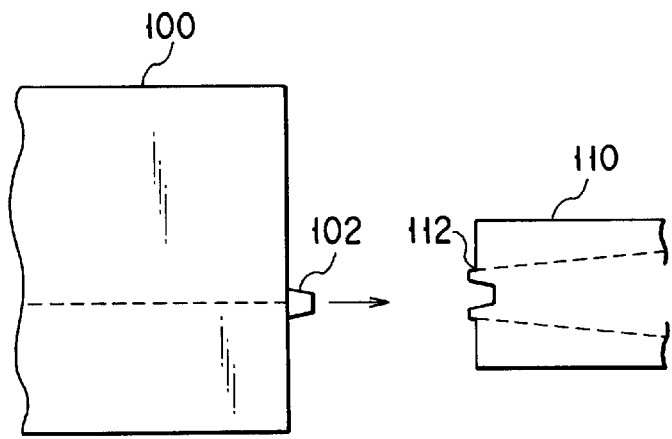
Figure 6C:
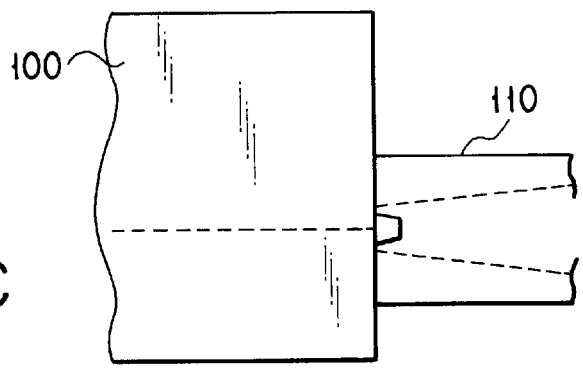

Alternatively, the thin film 102 shown in FIG. 6A may be made of negative photoresist, which is sensitized by light output from the edge emitting type semiconductor chip 100. After the edge emitting type semiconductor chip emits light beam, the photoresist is developed. As a result, a projected connection guide is formed on the side of the edge emitting type semiconductor chip 100, as shown in FIG. 6B. A recess connection guide is formed on the tapered optical wave guide 110, as shown in FIG. 6B. In this case also, as shown in FIG. 6C, butt-joint can be achieved with high accuracy, that is, completely the same effect as described above can be obtained.

Figure 7A:
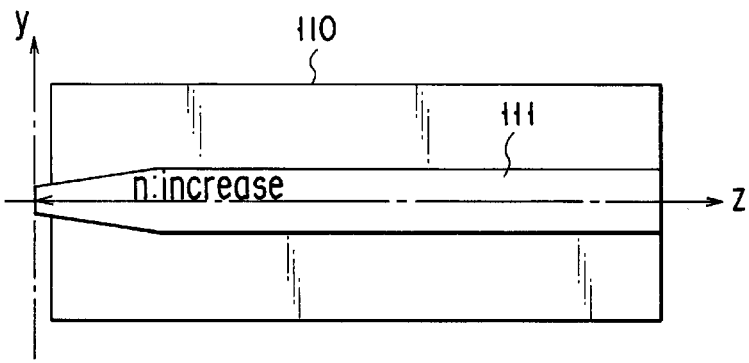
FIGS. 7A and 7B are cross-sectional views showing an example of the tapered optical waveguide of the present invention.
Figure 7B:
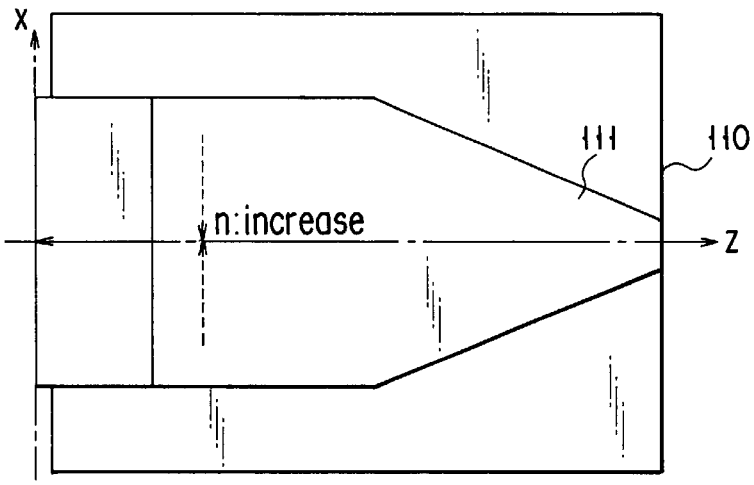

FIGS. 7A and 7B show an example of the tapered optical waveguide 110.

It is assumed that an edge emitting type semiconductor chip 100 is connected to the left side of the tapered optical waveguide 110 and an optical fiber 120 is connected to the right side thereof. As shown in FIGS. 7A and 7B, a three-dimensional coordinate system is provided, in which the origin of the coordinate axes is the contact point with the edge emitting type semiconductor chip 100, the z-axis corresponds to an optical axis through which light is traveling in a core portion 111 of the tapered optical waveguide, the y-axis corresponds to the thickness direction of the core portion 111 of the tapered optical waveguide, the x-axis corresponds to the width direction thereof.

In the tapered optical waveguide, the thickness of the core portion 111 along the y-axis is reduced and the index of refraction n thereof is increased toward the left (the contact point with the edge emitting type semiconductor chip 100). It is assumed that the difference between the index of refraction of the clad and that of the core is Δn. The light trapping effect of the optical waveguide is reduced as the thickness of the core is reduced. Therefore, in order to suppress the loss due to a change in shape of the optical beam, it is very effective to increase the value of Δn and increase the light trapping effect by increasing the index of refraction of the core in accordance with the decrease in thickness of the core.

A width direction (x-plane) GRIN lens as shown in FIGS. 7A and 7B is formed, in which the index of refraction of the core portion is higher in the central portion in the width direction along the x-axis. The width on the x-plane is reduced (tapered) toward the contact portion with the optical fiber 120. The GRIN lens is effective means for changing a plane wave on the x-plane output from the edge emitting type semiconductor chip 100 to the shape of a Gaussian beam of the optical fiber 120.

Naturally, the GRIN lens effect can be omitted, if the active layer 101 of the edge emitting type semiconductor chip 100 has a small width, or light is not a plane wave on the x-plane but a Gaussian beam in the optical waveguide of the activation layer 101 of the edge emitting type semiconductor chip 100.

Figure 8A:
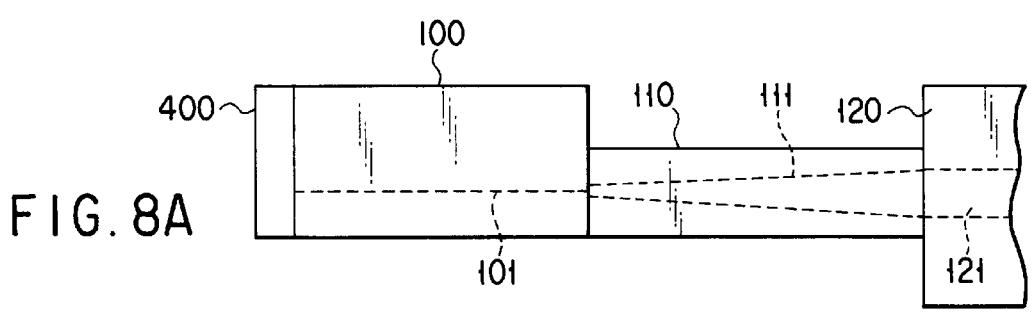
FIGS. 8A and 8B are a side view and a plane view showing still another embodiment of the present invention.
Figure 8B:
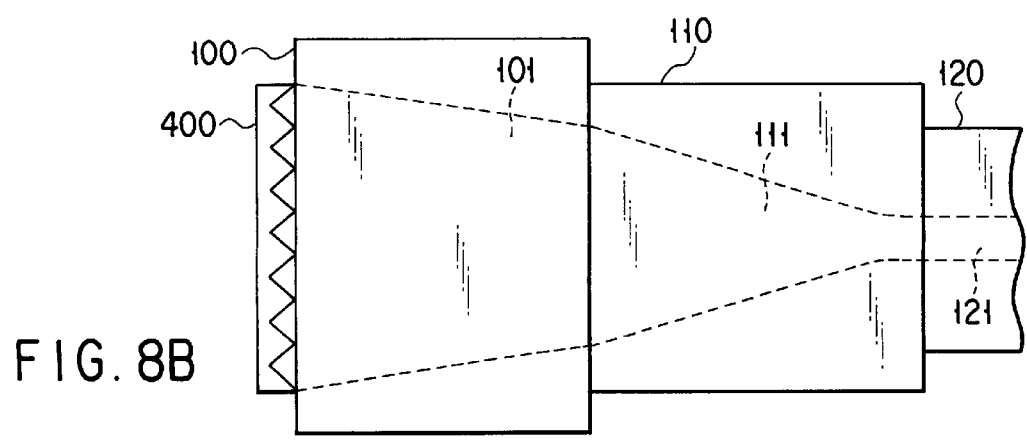

FIG. 8A (a side view) and FIG. 8B (a top view) show an embodiment of the present invention to which the tapered optical waveguide 110 as shown in FIGS. 7A and 7B is applied. An edge emitting type semiconductor chip 100 is connected to the left side of the tapered optical waveguide 110 and an optical fiber 120 is connected to the right side thereof. In the width direction of the core portion 111 of the tapered optical waveguide 110, the width of the Gaussian beam of the optical fiber core portion 121 is maintained. In the plane view, the light beam has a parabolic and a spread form to the left of the connecting portion between the optical fiber 120 and the core portion 111. In the side view, the beam has a conical shape. In the edge emitting type semiconductor chip 100, the active layer 101 is continuous to the core portion 111 of the tapered optical waveguide 110, forming an optically continuous fan shape. A reflection mirror 400 is arranged at the other edge of the edge emitting type semiconductor chip 100.

FIGS. 8A and 8B show a cubic mirror arranged along the width direction as the reflection mirror 400. However, a concave cylindrical mirror may be used as the reflection mirror 400. In this case also, the same effect as described above can be obtained.

Figure 9A:
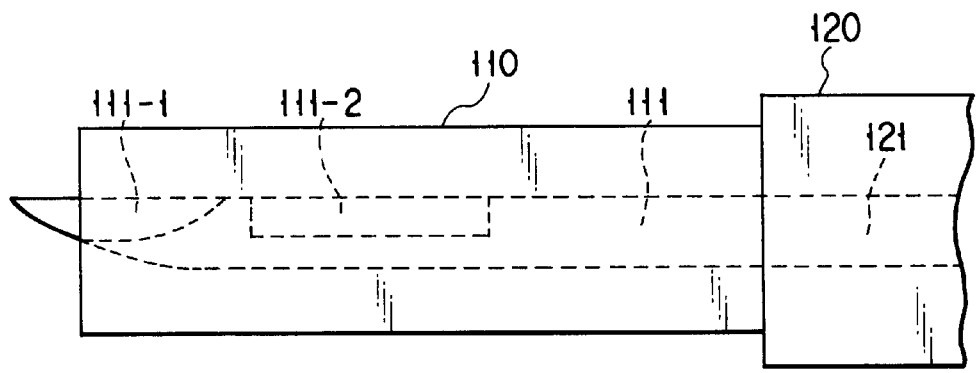
FIGS. 9A, 9B and 9C are a side view, a plane view and a partial cross-sectional view showing further embodiment of the present invention.
Figure 9B:
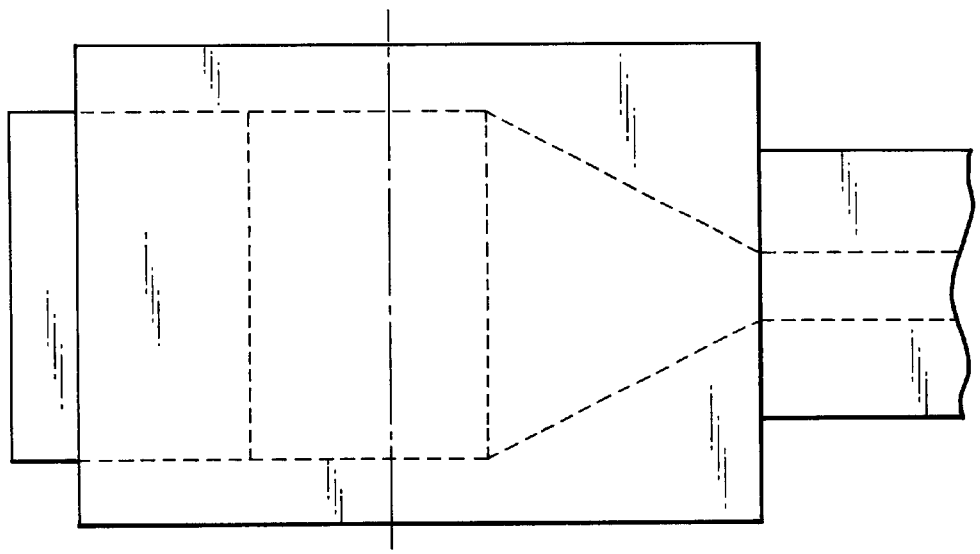
Figure 9C:
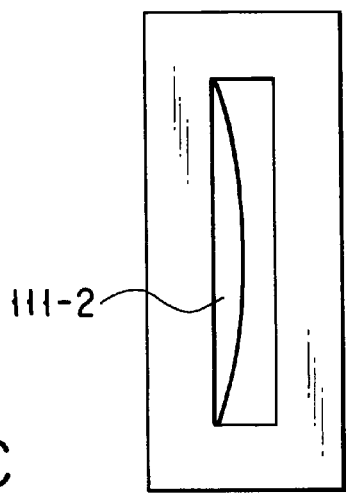

FIGS. 9A to 9C show an embodiment in which the effect of the embodiment shown in FIGS. 7A and 7B can be obtained more easily. FIG. 9A is a side view and FIG. 9B is a top view.

It is assumed that the index of refraction of a core portion 111 of a tapered optical waveguide 110 is n1. A core end portion 111-1 in a left portion in the drawing has an index of refraction n2 (n2>n1). In the case where the core (graded index lens) is constituted by the combination of two thin layers, the index of refraction of the core can be regarded as approximately equal to the average of the indexes of refraction of the two layers. Therefore, in the core portion 111-1, the thickness is the smallest and the index of refraction is the maximum n2 at the left end. The thickness is increased toward the right, and the index of refraction is reduced to n1.

Similarly, a core portion 111-2 has an index of refraction n2. FIG. 9C is a cross-sectional view of the core portion 111-2. As described above, the index of refraction of the core portion made of two thin layers can be regarded as approximately equal to the average of the indexes of refraction of the two layers. Therefore, the core portion 111-2 provides a GRIN lens effect, in which the index of refraction is great in the central portion around the optical axis, and becomes smaller as the distance from the optical axis increases.

Figure 10:
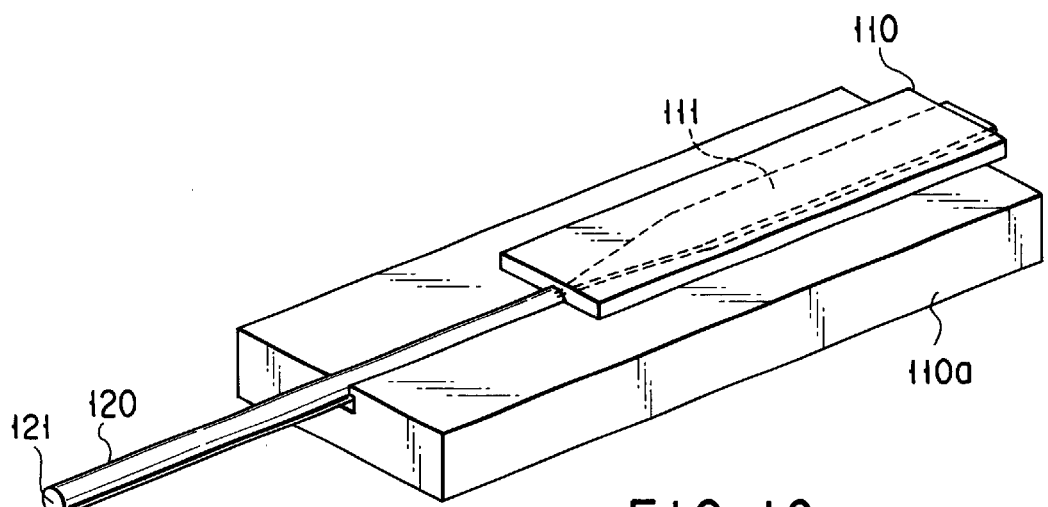
FIG. 10 is a perspective view showing an example of interconnection between a tapered optical waveguide and an optical fiber.
Figure 11A:
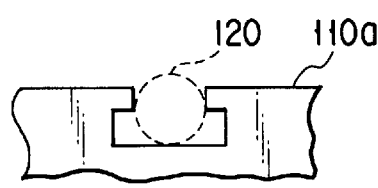
FIGS. 11A and 11B are diagrams showing examples of attachment an optical fiber.
Figure 11B:
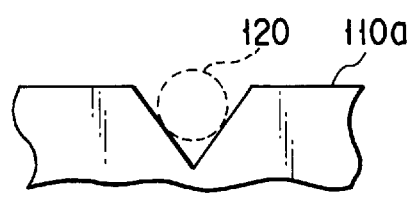

FIG. 10 shows an example of the connection between a tapered optical waveguide 110 and an optical fiber 120. The tapered optical waveguide 110 shown in FIG. 10 has upper and lower clad portions, between which a core portion 111 is sandwiched. The lower clad portion 110a is greater than the upper clad portion, and serves as a base on which an optical fiber 120 is mounted. The optical fiber 120 is supported by three points in a recess structure as shown in FIG. 11A, or two points in a V groove structure as shown in FIG. 11B. As a result, the position of a core portion 121 of the optical fiber 120 relative to the core portion 111 of the tapered optical waveguide can be set precisely, so that only mechanical accuracy is required to assemble the elements.

Figure 12:
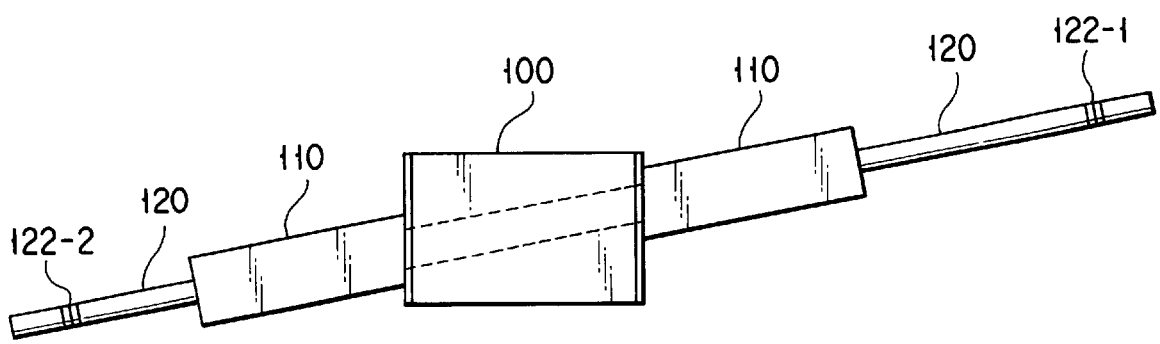
FIG. 12 is an external view of an example in which both edges of a semiconductor chip of edge emitting type are AR-processed and a tapered optical waveguide and an optical fiber are connected to each edge.

FIG. 12 shows a structure in which both edges of an edge emitting type semiconductor chip are AR-processed and a tapered optical waveguide and an optical fiber are connected to each edge. Two optical fibers 120 have fiber gratings 122-1 and 122-2. The reflectance of the two fiber gratings 122-1 and 122-2 may be set to desired values. For example, the fiber grating 122-1 has a relatively high reflectance, so that a part of the optical output passed therethrough can be received by a photodiode and used for an APC (automatic output power control) monitor. The fiber grating 122-2 has a relatively low reflectance, so that light passed therethrough can be used as an external output light.

As has been described above, the present invention can provide an inexpensive, high-power optical fiber output semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical fiber output semiconductor device comprising:
   an edge emitting type semiconductor element having an active layer and an output edge;
   a tapered optical waveguide, formed of rubbery material, having a structure for accommodating expansion and contraction due to a change in temperature and a first edge butt-joined to the output edge of the edge emitting type semiconductor element; and
   an optical fiber connected to a second edge of the tapered optical waveguide.

2. An optical fiber output semiconductor device according to claim 1, wherein the tapered optical waveguide is made of silicone.

3. An optical fiber output semiconductor device according to claim 1, wherein the edge emitting type semiconductor element has a guide groove of substantially same shape as a cross section of the active layer on the output face, and the tapered optical waveguide is attached to the guide groove.

4. An optical fiber output semiconductor device according to claim 1, wherein:
   a film made of material, which absorbs light output from the edge emitting type semiconductor element and is heated and melted or sublimed by the light, is formed on the output face of the edge emitting type semiconductor element;
   a guide for attachment of the tapered optical waveguide is formed on the edge emitting type semiconductor element by means of light output from the edge emitting type semiconductor element by melting or subliming a portion of the film through which the light is passed;
   the first edge of the tapered optical waveguide is butt-joined to the edge emitting type semiconductor element along the guide, and the second edge of the tapered optical waveguide is connected to the optical fiber.

5. An optical fiber output semiconductor device according to claim 4, wherein the film formed on the output face is made of material, which absorbs light output from the edge emitting type semiconductor element, is heated and melted or sublimed by the light, and transmits part of the light.

6. An optical fiber output semiconductor device according to claim 1, wherein:
   a film made of photoresist, which is sensitive to output light from the edge emitting type semiconductor element, is formed on the output face of the edge emitting type semiconductor element, a portion of the film made of photoresist is sensitized by the output light, and the sensitized portion is removed to serve as an output light passage portion, thereby forming a guide for attachment of the tapered optical waveguide;
   the first edge of the tapered optical waveguide is butt-joined to the edge emitting type semiconductor element along the guide; and
   the second edge of the tapered optical waveguide is connected to the optical fiber.

7. An optical fiber output semiconductor device according to claim 6, wherein:
   the tapered optical waveguide includes a core portion having a higher index of refraction on a side connected to the edge emitting type semiconductor element; and
   in the context of an x-y-z coordinate system, wherein a z-axis represents an optical axis through which light output from the edge emitting type semiconductor element is traveling, and an x-axis and a y-axis represent two axes on planes perpendicular to the z-axis, the index of refraction of the core portion decreases with travel of the light along the z-axis and with increase in width of the core portion along the y-axis.

8. An optical fiber output semiconductor device according to claim 1, wherein:
   in an x-y-z coordinate system, wherein a z-axis represents a direction of travel of light output from the active layer of the edge emitting type semiconductor element, and an x-axis and a y-axis represent two axes on planes perpendicular to the z-axis, the tapered optical waveguide has a width along the x-axis which decreases with travel of the light along the z-axis and a width along the y-axis which increases with travel of the light along the z-axis.

9. An optical fiber output semiconductor device according to claim 7, wherein the tapered optical waveguide includes a core portion comprising a plurality of thin films having different indexes of refraction.

10. An optical fiber output semiconductor device according to claim 9, wherein a graded index lens is used as a focusing element.

11. An optical fiber output semiconductor device according to claim 8, wherein the tapered optical waveguide includes a core portion, which has a focusing function in a central portion around the z-axis on a plane along the x-axis.

12. An optical fiber output semiconductor device according to claim 11, wherein the graded index lens comprises a plurality of thin films having different indexes of refraction.

13. An optical fiber output semiconductor device according to claim 12, wherein the active layer of the edge emitting type semiconductor element has, along the x-axis, a width corresponding to a parabolic or conic section optically continuous to the tapered optical waveguide connected thereto, and a constant width along the y-axis.

14. An optical fiber output semiconductor device according to claim 1, wherein an antireflection film is formed in advance on the output edge of the edge emitting type semiconductor element.

15. An optical fiber output semiconductor device according to claim 1, wherein the edge emitting type semiconductor element has two emission edges of low reflectivity, respectively connected to tapered optical waveguides to which optical fibers are connected, and at least one of the optical fibers outputs light.

* * * * *